(12) United States Patent
Herbert (10) Patent No.: US 7,394,230 B1
(45) Date of Patent: Jul. 1, 2008

(54) TOTAL CHARGE MEASUREMENT

(76) Inventor: Edward Herbert, 1 Dyer Cemetery Rd., Canton, CT (US) 06019-2029

(*) Notice: Subject to any disclaimer, the term of this patent is extended or adjusted under 35 U.S.C. 154(b) by 453 days.

(21) Appl. No.: 11/163,308

(22) Filed: Oct. 13, 2005

Related U.S. Application Data (60) Provisional application No. 60/522,641, filed on Oct. 23, 2004, provisional application No. 60/593,110, filed on Dec. 10, 2004.

(51) Int. Cl.
  *G05F 1/10* (2006.01)
  *H02J 7/00* (2006.01)
(52) U.S. Cl. ................................ 323/234; 320/166
(58) Field of Classification Search .......... 323/234, 323/265, 267, 268, 275, 280, 285, 288; 307/109; 320/116, 121, 132, 166
See application file for complete search history.

(56) References Cited

U.S. PATENT DOCUMENTS 6,121,761 A * 9/2000 Herbert ..................... 323/282
7,002,328 B2 * 2/2006 Kernahan et al. ........... 323/283
7,139,180 B1 * 11/2006 Herbert ..................... 363/124

* cited by examiner

*Primary Examiner*—Adolf Berhane (57) ABSTRACT

In a fast power converter with distributed output capacitors with parasitic impedances between them, the settling time of the output voltage is too long, making voltage unsuitable as a control input. The charge on each of the distributed output capacitors can be measured, preferably differentially, in a summing network in which the conductance of each of the summing resistors is proportional to the capacitance of the capacitor with which it is associated. The charges can be summed as a total charge control input for the fast power converter. The total charge control is very sensitive to changes in the output current, and is insensitive to lags, ringing and/or oscillations of the voltages among the distributed capacitors. If the output capacitor of a VRM is small compared to the total capacitance, the impedance of its connector is largely mitigated.

8 Claims, 5 Drawing Sheets

TOTAL CHARGE MEASUREMENT

CROSS REFERENCE TO RELATED APPLICATIONS

This application claims priority to a Provisional U.S. Patent Application Ser. No. 60/593,110 filed Dec. 10, 2004, entitled "Switched Current Power Converter" and a Provisional U.S. Patent Application Ser. No. 60/522,641, filed Oct. 23, 2004, entitled "Fast Transition Power Converters". Reference is made to U.S. Pat. No. 6,121,761, entitled "Fast Transition Power Supply", issued on Sep. 19, 2000, and to a U.S. patent application Ser. No. 10/709,484, entitled "Switched-Current Power Converter", filed on May 8, 2004. These applications and patents are incorporated herein by reference.

BACKGROUND OF THE INVENTION

This invention relates to power converters, and more particularly to power converters having a very fast dynamic response of the output current to changes in the load. One application, as an example, not a limitation, where fast response is important is power converters that supply power for microprocessors and the like.

SUMMARY OF THE INVENTION

The fast transition power converter uses one or more "constant current" sources, the output(s) of which are switched either to the output capacitor and the load or to the return. The converter current can change as rapidly as solid state switches can change state, so changes in the output current can be very fast, with no theoretical limit in the di/dt. Because the fast transition power converter switches relatively fixed increments of current to the output capacitor and the load or to ground, it is a true digital power converter. For a given state of the switches, the current to the output capacitor and the load is fixed at discrete quantities. Intermediate currents are achieved by modulating between states.

It is common in the specifications for power converters for microprocessors and the like (as an example, not a limitation) to require a higher voltage at a lower current and a lower voltage at a higher current. For such power converters, the voltage on the output capacitor may be used to control directly the current to the output capacitor and the load. An example is described below in the detailed description of the invention.

One embodiment of the switched current power converter uses a flash analog to digital converter and the outputs of the comparators of the flash a-d converter directly control the current switches. In theory, the output voltage of the power converter can feed directly to the comparators. A challenge in the control of a fast transition power converter is the rapid and accurate measurement of the output voltage, a task that is severely complicated by having several distributed output capacitors with parasitic inductances in the capacitors, the interconnections between them and the other components of the power converter and the load. The output voltage takes too long to settle and therefore, it is not suitable as the control input for a very fast power converter.

This invention teaches that measuring the total charge in the plurality of distributed capacitors is preferred. Because the total charge differs from the voltage by a constant term, the total capacitance, the total charge may be used in lieu of the output voltage for control.

BRIEF DESCRIPTION OF THE DRAWINGS

FIG. 4 shows a representative graph showing the power converter output voltage and current characteristics of a representative power converter for a microprocessor and the like.

DETAILED DESCRIPTION

Figure 1:
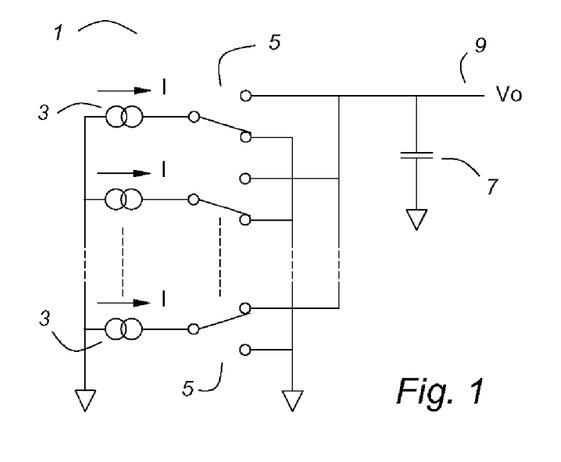
FIG. 1 shows the power components of a switched current power converter.

FIG. 1 shows the power circuits of a switched current power converter 1. A plurality of current sources 3-3 each output a current I to a plurality of switches 5-5. The individual switches 5-5 can switch their respective currents I either to the return or to an output capacitor 7. The voltage Vo on the capacitor 7 is the output 9 of the power converter 1.

In the drawings, like references designators refer to the same item from drawing to drawing.

Figure 2:
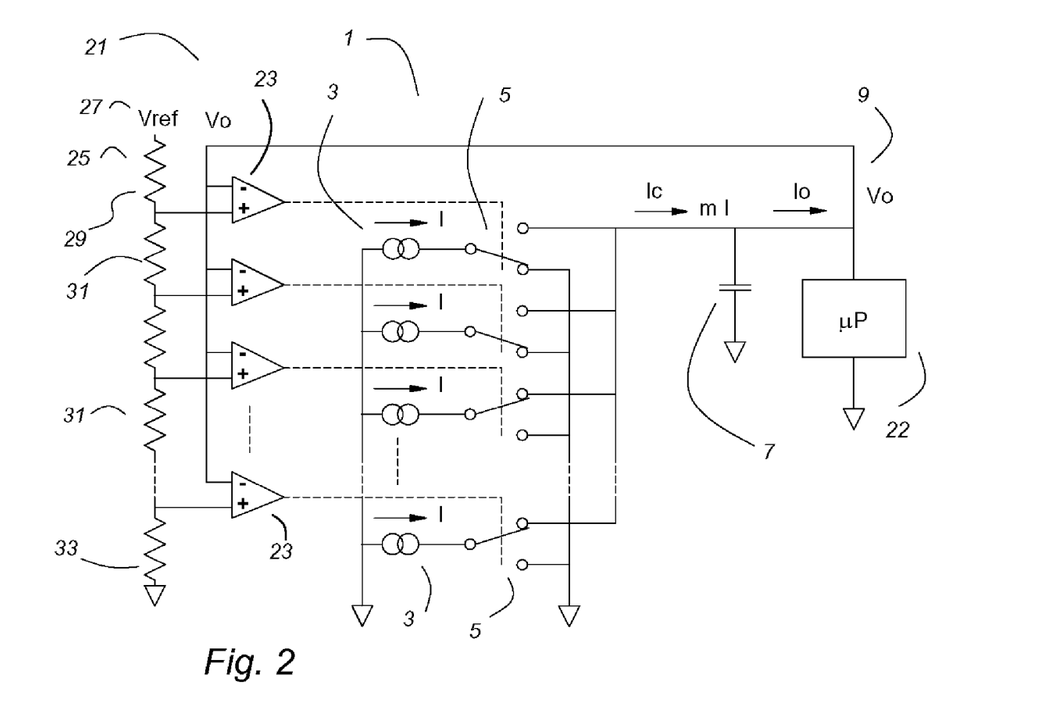
FIG. 2 shows a switched current power converter in which a flash analog to digital (a-d) converter directly controls switches that control the current to the output capacitor and the load.

FIG. 2 shows a switched charge power converter 21, which is the switched current power converter 1 of FIG. 1 with a control circuit. FIG. 2 also shows a load 22 as a microprocessor, as an example, not a limitation. The control comprises a plurality of comparators 23-23 having as their non-inverting (+) inputs the nodes of a resistor ladder network 25. The resistor ladder network 25 comprises a high side resistor 29 that is connected to a voltage reference 27 having a voltage Vref. Between the nodes of the resistor ladder network are a plurality of smaller resistors 31-31 that define the voltage increment from node to node as would be understood by one skilled in the art of analog circuit design. A return side resistor 33 completes the resistor ladder network 25. The inverting inputs (−) of the comparators 23-23 are connected together and to the output 9 to monitor the output voltage Vo.

In operation, if the output voltage Vo is lower than any of the node voltages of the resistor ladder network 25, then all of the comparators 23-23 will be on and all of the current sources 3-3 will be connected through the switches 5-5 to the output capacitor 7 and the load 22. This is the usual condition during initial turn on and power up of the switched current power converter 21.

As the output voltage Vo rises, eventually it will exceed the value of the lowest node voltage of the resistor ladder network 25, and a first one of the comparators 23-23 will turn off, turning off a first one of the switches 5-5, reducing the converter current Ic by one increment I to the output capacitor 7 and the load 22. As the voltage Vo continues to rise, one by one more of the comparators 23-23 and the switches 5-5 will turn off until the current Ic nominally equals the output current Io, at which time steady state control is established and the voltage Vo will rise no further. Because the current Ic is in discrete increments of the current I from the current sources 3-3 and the current Ic likely will not exactly equal the output current Io, one of the comparators 23-23 and one of the switches 5-5 may modulate such that, over time, the average of the current Ic equals the output current Io. If m is the number of the comparators 23-23 and switches 5-5 that are on at any instant, the current Ic at that instant will equal mI.

In FIG. 2, the several comparators 23-23 and the ladder network 25 comprising the resistors 31-31, 29 and 33 with the reference voltage 27 together comprise a flash analog to digital converter. The resistors 29 and 33 may be comparatively large and the resistors 31-31 may be comparatively small so that the various nodes of the ladder network have equal incremental voltages within the limits of the specification of the fast transition power converter 21. Using representative characteristics, the incremental voltages may be ten equal steps from 0.95 volts to 1.05 volts.

The control in FIG. 2 is simplified and is only to show an example of a fast power converter for discussion. A practical control will have hysteresis, and one skilled in the art of analog design would know how to design a resistor ladder network with comparators to include hysteresis. The specific power converter used and its method of control is not at the heart of this invention. As the one of the comparators 23-23 and the one of the switches 5-5 is modulating, the converter current Ic steps between discrete increments of I, and the output voltage Vo will have a nominally triangular wave form between the limits determined by difference between the node voltages of the resistor ladder network 25 and the hysteresis. The average converter current Ic will equal the output current Io, and the output voltage Vo will have a generally rising voltage as the current decreases, determined by the span of the several nodes of the resistor ladder network 25 with consideration of the effects of hysteresis. The hysteresis will tend to flatten the slope of the voltage characteristic.

Figure 3:
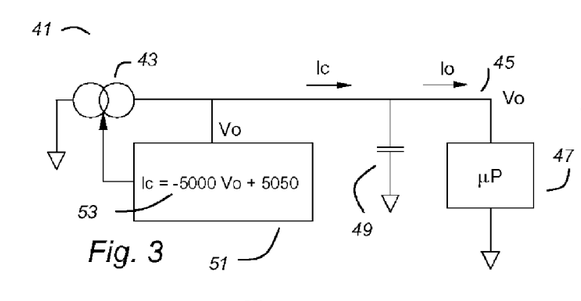
FIG. 3 shows a block diagram schematic of a fast power converter in which the output voltage Vo directly controls the converter current Ic going to the output capacitor and the load.

FIG. 3 shows a block diagram schematic of a fast power converter 41 comprising an ideal variable current source 43 and an output capacitor 49. An output load 47 is shown as a processor (μP) as an example, not a limitation. The ideal variable current source 43 of the fast transition power converter 41 direct controls a converter current Ic to the output capacitor 49 and the load 47 as linear function of the output voltage Vo on the output 45 of the fast transition power converter 41 in a control circuit 51. The output voltage Vo quantity is factored by a linear scaling factor to determine the converter current Ic from the ideal variable current source 43. In FIG. 3, the scaling factor is the equation Ic=−5000 Vo+5050, as an example, not a limitation. This will have an increasing voltage with decreasing current and thus it is a useful average state model for the power converter of FIG. 2.

Figure 4:
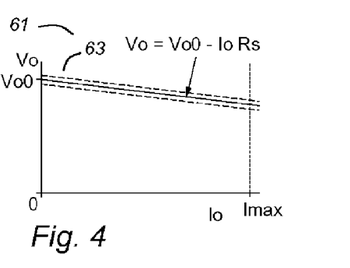

FIG. 4 shows a graph 61 having a representative characteristic line 63 of the output voltage Vo versus the output current Io of a power converter. As an example, not a limitation, some power converters for microprocessors have similar characteristics. As can be seen, if the output current is higher, the output voltage is lower, and vice versa. In the example of FIG. 4, the limits on the output current Io may be zero and 100 amperes, as an example, not a limitation. If a particular application requires it, these limits can be expanded, as, for example, increasing the high limit to provide an overload capability or extending below zero to provide for negative current flow. Many loads will never go to zero load current, so embodiments of the invention that have some minimum current flow greater than zero are also useful.

Using algebra, the control equation can be solved for either the converter current Ic or the output voltage Vo. An example of a solution with converter current Ic as the dependent variable is the control function in FIG. 3. For many purposes, a solution in terms of output voltage Vo is more useful, and it will have the form Vo=Vo0−IoRs, where Vo0 is the no load output voltage and Rs is an impedance term.

A flash analog to digital converter is extremely fast, as is the time that is required to change the state of the comparators and the solid state switches, so the switched current power converter 21 of FIG. 2 can have very good dynamic response. So good, in fact, that it may respond excessively to noise and other artifacts in the measurement of the output voltage Vo.

The switched current power converter also has no theoretical di/dt limit. Some practical considerations will limit the extent to which this ideal can be realized, and the settling time until the output voltage is stable for control purposes is one of the more significant problems.

The power converter, its interconnection system and the load have a number of distributed capacitors, and there are significant stray inductances between them, both on the power side and in the return. The stray inductance of any connectors in the power delivery path is particularly troublesome.

To control the output voltage with a changing load current Io, the power converter injects a converter current Ic into the power distribution system. The current then spreads through the power distribution system to the various capacitors and the output. The stray inductances will cause a lag and there may be oscillations. Accurate control requires that the voltage be measured rapidly and accurately, a difficult task in view of the lags and possible oscillations.

A power converter for a microprocessor or similar applications must respond to very fast changes in current. A microprocessor can transition from a high current to a low current in a few machine cycles, resulting in very high rates of change of current, or high di/dt. The voltage across an inductor equals the inductance times the di/dt, so it can be very challenging to measure voltage accurately when parasitic inductances are present, as they always are in a practical circuit. Further, a practical circuit may have a number of output capacitors distributed across the power converter, nominally connected in parallel, but separated by interconnections and connectors all having associated parasitic inductances, both in the power bus and in the return.

Figure 5:
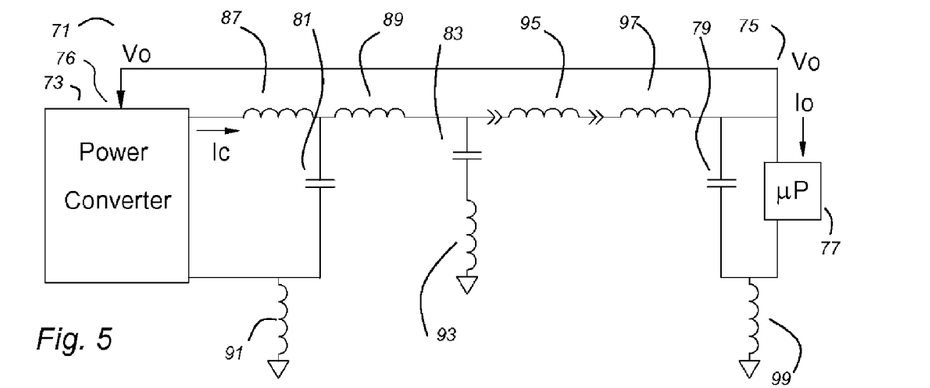
FIG. 5 shows a fast power converter with three distributed capacitors and the parasitic inductances of the circuitry between them, the current source and the load. The control input of the power converter is the output voltage Vo of the fast power converter. This circuit has stability problems due to the settling time of the output voltage Vo.

FIG. 5 shows a representative fast power converter circuit 71 comprising a power converter 73 and three output capacitors 81, 83 and 79, shown with representative parasitic inductances 87, 89, 91, 93, 95, 97 and 99. A "parasitic inductance" is an unintentional inductance, not a component or a design feature but a characteristic of the current conducting path through the circuitry. The power converter 73 controls the converter current Ic to maintain the correct voltage Vo on the output 75. The current Ic finds its way to the output capacitors 81, 83 and 79 and a load 77 through the several parasitic inductances 87, 89, 91, 93, 95, 97 and 99. If the parasitic inductances were all zero (an ideal circuit), the voltages on the capacitors 81, 83 and 84 would be equal at all times and the control input 76 of the power converter 73 could be wired directly to the output 75 as shown. In a practical circuit, the capacitors 81, 83 and 79 and the parasitic inductances 87, 89, 91, 93, 95, 97 and 99 are a reactive distributed impedance. There will be significant delay between generating the converter current Ic and the time that the voltage Vo on the output 75 settles down to its final value. There may be ringing as well. Thus the output voltage Vo is not suitable for fast control purposes.

Applying the teachings of this invention requires a fast and stable control input so that the correct converter current Ic may be generated by the power converter 73. However, the voltage Vo, if measured at the load, will include voltages attributable to the changing current in the parasitic impedances, and the charge will first be removed from the closest output capacitor 79, both effects combining to exaggerate the effects of a change of the load 77 on the measured voltage Vo. Uncompensated, this would result in an exaggerated response by the power converter and an exaggerated current Ic to the output capacitors 81, 83 and 79 and the load 77. The lag through the various parasitic inductances 87, 89, 91, 93, 95, 97 and 99 delays the voltage response to this exaggerated current Ic at the output capacitor 154, allowing it to persist for a time, which will very likely be unstable, resulting in ringing and/or oscillation.

Figure 6:
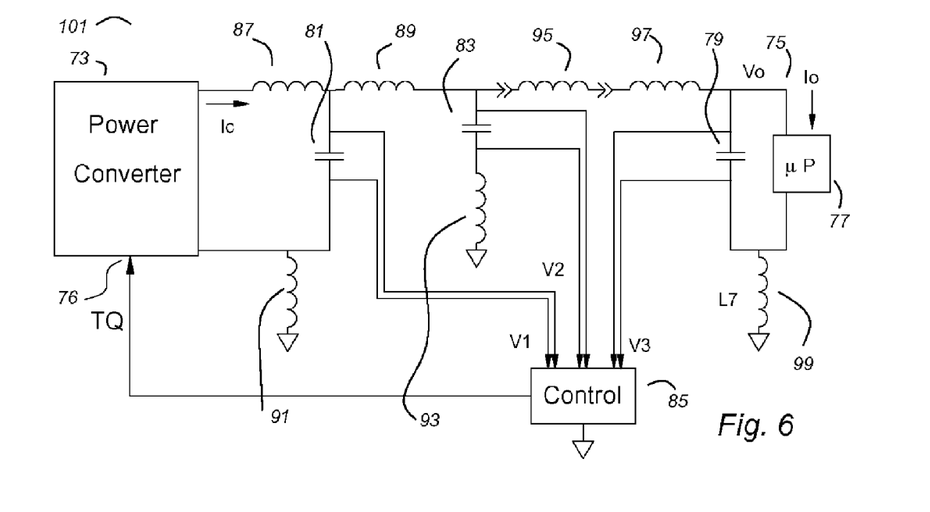
FIG. 6 shows a fast transition power converter with three distributed capacitors and the parasitic inductances of the circuitry between them, the current source and the load. The control samples the voltage on the capacitors differentially to generate a total charge control input to the power converter.

FIG. 6 shows that the voltage may be measured differentially at the various distributed output capacitors 81, 83 and 79. For purposes of discussion, three differential voltages V1, V2 and V3 are shown in FIG. 6, though a practical circuit may have fewer or more measurement points. The differential voltages V1, V2 and V3 are scaled as their respective capacitors so as to measure the respective charge on the capacitors 81, 83 and 79, and the charges are summed in a control block 85 to produce a total charge control signal TQ for the control input 76 of the power converter 73.

A control circuit for a power converter is said to be responsive to a total charge signal if the power converter is controlled by the total charge signal, that is, if the power converter output is adjusted under control such that the total charge is maintained at a specific value or schedule and a departure from the desired total charge causes the power converter output to change so as to bring the total charge to within its desired limits or schedule.

Figure 7:
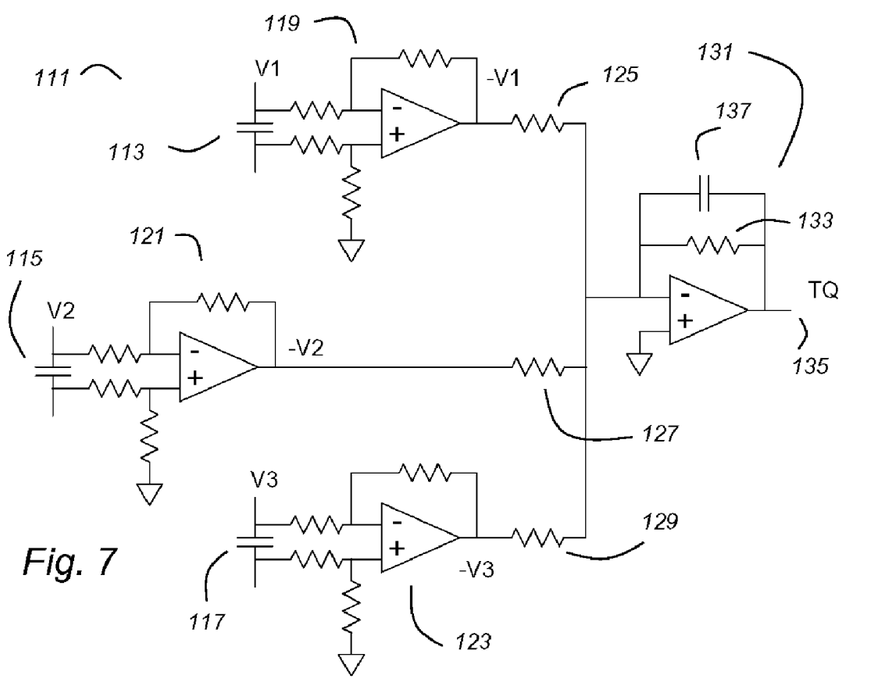
FIG. 7 shows a circuit for measuring the total charge of the capacitors of FIG. 6. The voltages of the three capacitors voltages are measured differentially, then the voltages are summed to a common output TQ. The summing resistors are weighted to reflect the different capacitances of the three capacitors.

If the total charge in the various capacitors is measured and summed, a much faster and more accurate control is possible. To introduce the concept of total charge, TQ, please see FIG. 7. FIG. 7 shows a total charge measurement circuit 111, which may be the control 85 of FIG. 6. Three differential amplifiers 119, 121 and 123 measure the three input voltages V1, V2 and V3 differentially and output them inverted and referenced to local return as three negative voltages −V1, −V2 and −V3. A differential amplifier may include an operational amplifier and resistors connected as shown in FIG. 7 as an example, not a limitation, and the specific design of a differential amplifier is not at the heart of the invention. One skilled in the art of analog circuit design will know how to design and use suitable differential amplifiers for various applications. The differential amplifiers may include scaling and frequency compensation.

A charge measuring circuit is any apparatus that can determine the charge on a capacitor and output a signal that is proportional to the charge. A summing circuit is any apparatus that can collect and totalize the output signals of two or more charge measuring circuits to produce a signal that is proportional to the sum of the charges, or the "total charge".

The voltages of the capacitors 113, 115 and 117 are measured, differentially to account for ground differences. The charge on a capacitor is determined as the voltage times the capacitance. If the summing resistors 125, 127 and 129 have their conductances proportional to the respective capacitances of the respective capacitors 113, 115 and 117, the output 135 of the summing amplifier 131 is proportional to the total charge, TQ. Because the total charge TQ is linearly proportional to the voltage, it can be used for control purposes instead of the output voltage, with appropriate scaling.

The three negative voltages −V1, −V2 and −V3 are summed through summing resistors 125, 127 and 129 respectively to an operational amplifier 131. The values of the summing resistors 125, 127 and 125 and a feedback resistor 133 scale the output 135 of the operational amplifier 131, and the output is inverted once again so that it has the same polarity as the originally measured voltages V1, V2 and V3. A feedback capacitor 137 shows that compensation may be incorporated into the circuit, but it is not the intent of this illustration to suggest any particular compensation scheme. That would be appropriately determined during the design for a particular application. A slew rate limit may be preferred to a roll off, but that would need to be determined on a case-by-case basis as a design tradeoff.

Note that the output 135 of the operational amplifier 131 is labeled "TQ", for "total charge", not a voltage. That is because the values of the summing resistors 125, 127 and 129 are preferably weighted as the inverse of the values of the respective capacitors 113, 115 and 117 at which the voltages V1, V2 and V3 are measured. The charge on a capacitor is given by Q=CV, so the voltage can be scaled to give the charge Q. Because the operational amplifier sums the currents into its inverting input, the appropriate scaling factor is the conductance of the resistor, that is, the reciprocal of its resistance.

Because voltage is a linear function of charge, charge can be used interchangeably with voltage (with appropriate scaling) in applying the teachings of this invention. In all of the discussions above, wherever it is taught to use the output voltage Vo to control the converter current Ic, a charge tQ may be substituted for the output voltage V0, with appropriate scaling.

In this specification and the claims, a recitation of a plurality of output capacitors necessarily includes parasitic impedances as there is necessarily interconnections between them and between the capacitors and the power converter and the load. Even in an array of low inductance MLCCs there will be a distributed R-L-C reactive impedance. When a capacitor is recited as having a charge measurement circuit, it includes a group of associated capacitors having a common charge measurement circuit. With a large array of capacitors, it may not be practical to measure the charge on each of them individually, but there is still a benefit in measuring the charge in several places. The measurement circuit is designed to measure the total charge of the group of capacitors and the capacitance value used for design is the total capacitance of the group of capacitors. "Each of the capacitors" is synonymous with "each of the groups of capacitors" when a group of capacitors is treated as if it were one capacitor.

Another way of analyzing the problem is to consider the current flow, remembering that current flow in amperes is the rate of charge transfer, in coulombs per seconds. A load current Io is flowing out of the switched current power converter 101, and a power converter current Ic is flowing into the output capacitors 81, 83 and 79, as shown in FIG. 6. The purpose of the control is to ensure that the converter current Ic flowing from the power converter 73 is correct at every instant. Considering that current, in amperes, is the rate of flow of the charge, in coulombs per second, the converter current Ic is correct if, and only if, at each instant, there is the correct total charge TQ in the system. Assuming that there are no leakage currents, the amount of charge in the system can be determined at any instant by summing the charge in all of the capacitors, and the current can be modulated to keep the total charge correct whether the voltages have settled out or not.

An objective of a power converter control is to provide a converter current Ic that is equal, on average, to the output current demand Io, with small variations as needed to correct voltage errors. Ideally, as soon as there is a change in the output current demand, the converter current being supplied will change to equal it.

For a high-speed control, current measurement is not practical. Not only are current measurement circuits very complex, they are also hopelessly slow. Voltage measurement at the output is not suitable either, as it may take a long time to settle down, far longer than is useable for control purposes for a fast power converter.

The solution is to measure the total charge of the capacitors in the power distribution system. This is an exquisitely sensitive measurement of current change, and it is immune to the voltage transients and ripple within the power distribution path. Any mismatch of the input and output currents shows very quickly as a change in the total charge. Total charge is easily measured with a resistor network, with one resistor connected to each capacitor or group of capacitors. If the conductance of each resistor is proportional to the capacitance of the capacitor with which it is associated, the common node has a voltage that is proportional to the total charge on the capacitors in aggregate.

Because amperes equals coulombs per second, when one controls the converter current Ic into the output capacitor and the load, one is controlling the charge per second delivered to the capacitor and the load. The control provides the correct charge at the correct rate to balance charge lost to the load and to add (or remove) charge to the capacitor if necessary to adjust its voltage. Thus, it makes sense to use the total charge TQ as the controlling parameter. If the total charge TQ is correct, the output voltage Vo will be correct at steady state.

If there is a single output capacitor in a power delivery system, total charge sensing and voltage sensing are equivalent. The charge is linearly related to voltage by the equation $Q=CV$, so $V=Q/C$. For many purposes, total charge sensing can be equated to output voltage sensing. However, there are important differences for the speed of response, stability, and series impedance mitigation, which are explained below.

Output voltage sensing has the problem that there is a significant delay between the change of voltage at the power supply and the output if parasitic inductances are present. The voltage at the power supply may overshoot badly with little immediate change in the output voltage. To compensate for this, the control loop is slowed down, resulting in a sluggish response. Trying to speed up the response may cause instability.

A correct total charge TQ does not ensure that the output voltage is correct at every instance, as there may be lags and oscillations due to the currents and changing currents in the complex impedance of the power distribution, but it does ensure that the voltage is right once the distribution system settles down. Further, it ensures that the voltage does not overshoot due to the lag through the distribution system, as it accounts for the charge stored in the up-stream capacitors.

The circuit of FIG. 7 is useful for teaching the concept of total charge TQ, but it has the disadvantage that if a large number of points in the circuit are to be measured, a large number of precision resistors and very fast amplifiers are needed. Further, the settling time through the amplifiers in series, each with its response and slew rate limitations, results in a significant lag. A much simpler and faster approach is shown in FIG. 8

Figure 8:
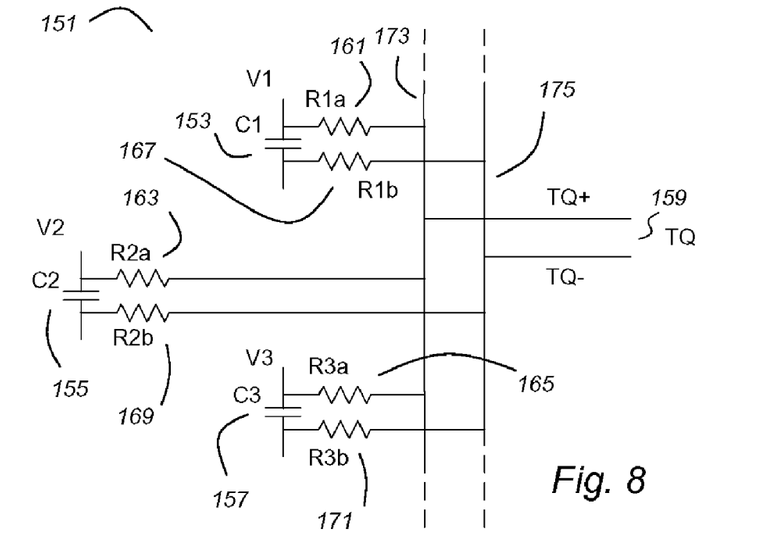
FIG. 8 shows a simplified circuit for measuring the total charge differentially.

FIG. 8 shows a simplified and much faster total charge measurement system 151. The charge on the capacitors 153, 155 and 157 is measured with respective high side resistors 161, 163 and 165 connecting to a high side total charge TQ+ reference bus 173 and with respective low side resistors 167, 169 and 171 connecting to a low side total charge TQ− reference bus 175 to provide a total charge function TQ on the output 159.

It is suggested that two layers of the current distribution bus be devoted to the total charge TQ measurement. Because these two layers will not conduct significant current, their foil may be thinner. At a number of points throughout the system, measurement points consisting of two resistors can connect the power distribution to the total charge measuring system, as shown, one on the power side and one on the return side. Three resistor pairs are shown in FIG. 7, for simplicity, but it is contemplated that a large number of measurement points would be used, including points on the processor die. The resistors need not be precise. Likely, screened on resistive ink would suffice.

If all of the resistors were equal, it is readily apparent that the output would be the average voltage. If, however, each resistor is sized so that its conductance (1/R) is proportional to the capacitance of the capacitor with which is it associated, then the output is a weighted average, and is proportional to the total charge, TQ. Expressed as equations:

$$C1R1a = C2R2a = C3R3a = \cdots = CnRna$$

$$C1R1b = C2R2b = C3R3b = \cdots = CnRnb$$

where C1, C2 and C3 are respectively the capacitors 153, 155 and 157 and Cn represents an indefinite number of additional capacitors, and where R1*a*, R2*a* and R3*a* are respectively the high side resistors 161, 163 and 165 and Rna represents an indefinite number of additional high side resistors, one for each additional capacitor Cn, and where R1*b*, R2*b* and R3*b* are respectively the low side resistors 167, 169 and 171 and Rnb represents an indefinite number of additional low side resistors, one for each additional capacitor Cn.

Note that the high side resistors and the low side resistors do not have to be equal, and it may be desirable to use smaller resistors in the return side, for a lower impedance ground return. On the high side, the resistors can be sized to improve impedance matching, considering transmission line effects.

In this specification and the claims, if the total charge measurement is single ended, the total charge output is simply "the total charge signal". If the total charge measurement is differential, the high side output is "the total charge signal" and the low side output is "the total charge signal return".

In FIG. 8, there is a duality of function of the resistors. They are a charge measurement circuit in that each pair of resistors (or each resistor, in the comparable single ended circuit) is scaled to measure the charge on the capacitor with which it is associated, and they are also the summing network in that they are connected to a common output reference signal and the weighted currents from all of them combine to comprise a total charge signal.

Figure 9:
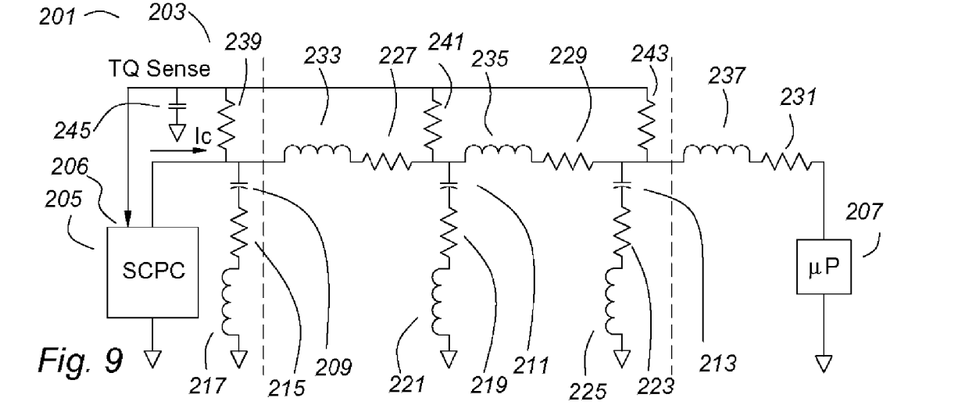
FIG. 9 shows a power distribution system with total charge measurement. To simplify the analysis, the high and low side parasitic inductances are lumped.

To simplify the analysis, the parasitic impedances of the switched current power converter 201 of FIG. 9 have been lumped as single ended impedances to remove voltage differences in the return from the equations. A power converter 205 generates a converter current Ic which then flows to a load 207, shown as a microprocessor, as an example, not a limitation. Three output capacitors 209, 211 and 213 are in the power distribution circuit, and they are shown with their respective parasitic resistances 215, 219 and 223, as well as their respective parasitic inductances 217, 221 and 225. There is also circuitry between the capacitors 209, 211 and 213 and the load 207, and the parasitic impedance of the circuitry is shown as parasitic resistances 227, 229 and 231 as well as parasitic inductances 233, 235 and 237.

The single ended total charge sense circuit 203 comprises three resistors 239, 241 and 243 connected respectively to the capacitors 209, 211 and 213 and to a control input 206 of the power converter 205. A capacitor 245 may provide a small roll-off. Analysis of this circuit is straightforward but quite involved. Therefore, it is suggested that SPICE modeling be used for ac analysis.

Figure 10:
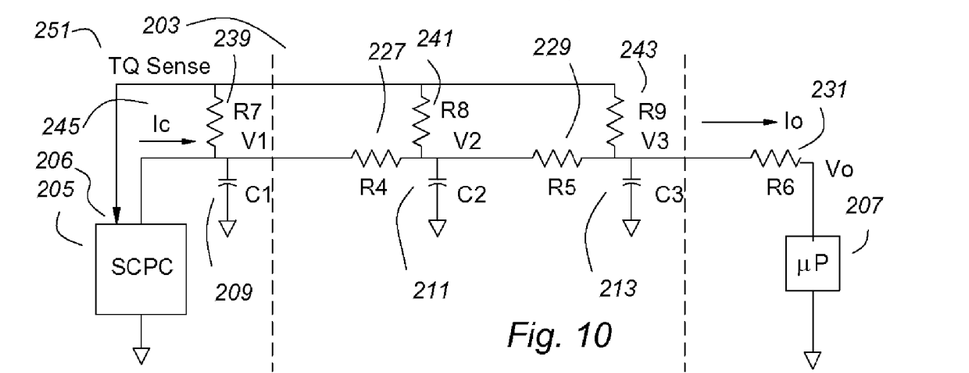
FIG. 10 shows the circuit simplified further, for analysis of the steady state voltage.

A steady state dc analysis is instructive and comparatively much easier. FIG. 10 shows the switched current power converter 201 of FIG. 9 but with a simplified schematic 251 in which the parasitic inductances have been left out, as have the parasitic resistances of the capacitors 209, 211 and 213. For easier representation in equations, several of the components have additional alphanumeric reference designations of the form more commonly used in electrical schematics and equations, C1 for the capacitor 209, R7 for the resistor 239, and so forth as can be seen easily in FIG. 10. The correlation is clear, so a complete recitation is not given. Three voltages also are shown, V1, V2 and V3, respectively, being the voltages on the capacitors C1, C2 and C3.

By inspection, the charge on the three capacitors is $$Q1=C1V1$$

$$Q2=C2V2$$

$$Q3=C3V3.$$

Therefore, the total charge TQ is given by $$TQ=C1V1+C2V2+C3V3$$

Also, by inspection, given an output current Io, $$V1=Vo+Io\ (R4+R5+R6)$$

$$V2=Vo+Io(R5+R6)$$

$$V3=Vo+IoR6$$

To simplify the final expression, let us define a total capacitance TC, a total charge reference TQR, and an equivalent resistance RE as follows:

$$TC=C1+C2+C3,\ \text{in farads}$$

$$TQR=TQ/TC,\ \text{in volts}$$

$$RE=(C1/TC)R4+((C1+C2)/TC)\ R5+R6,\ \text{in}\ \Omega$$

Substituting, collecting terms and rearranging yields the following expression for the output voltage Vo:

$$Vo=TQR-Io\ RE$$

Figures 11, 12, 14:
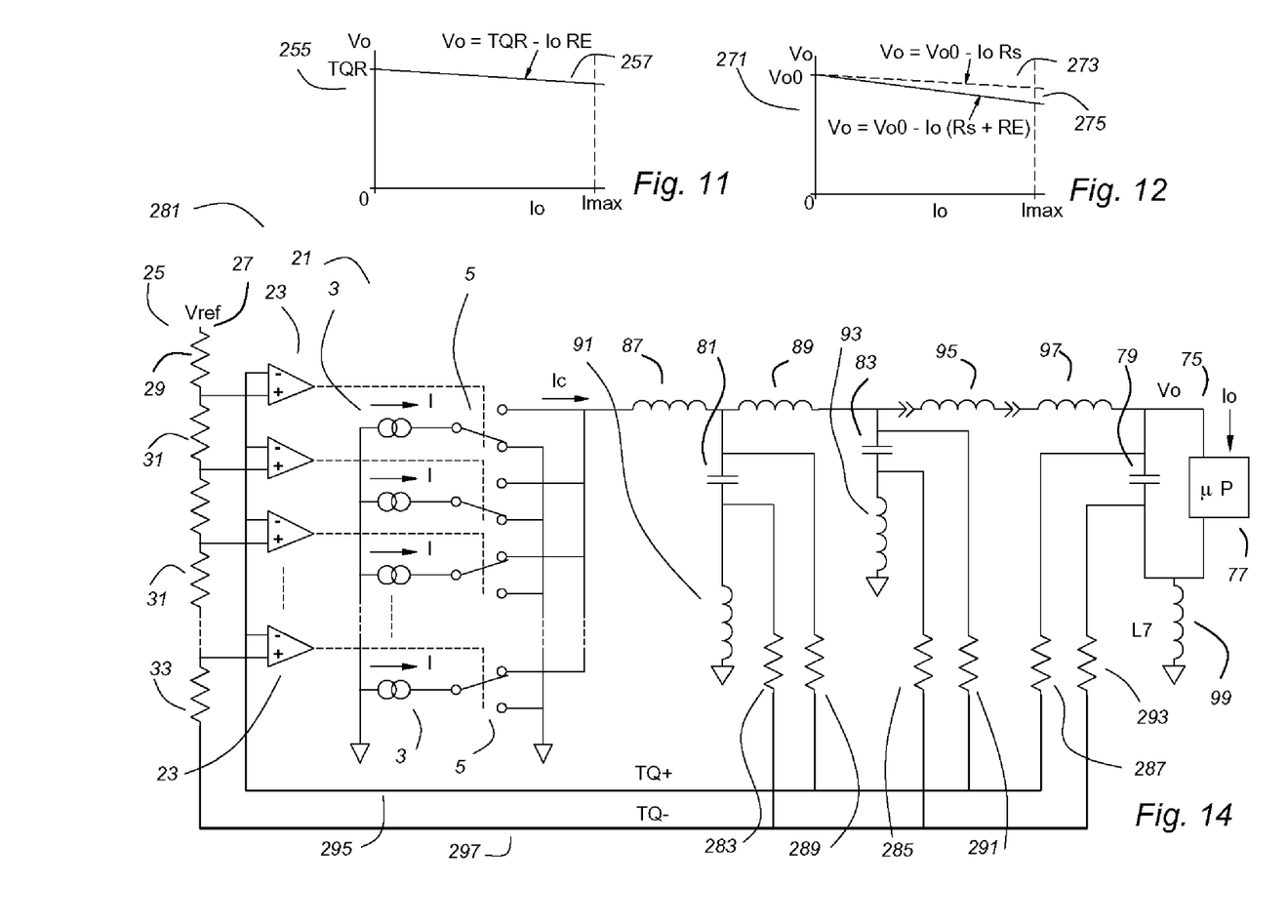
FIG. 11 shows the voltage versus current characteristic of a power converter using total charge as its control input.
FIG. 12 shows the combined effect on the output voltage Vo using a flash a-d converter with total charge measurement as the control for a switched current power converter.
FIG. 14 shows that an additional resistor may sample the output voltage Vo.

It can therefore be seen that TQR equals the no load output voltage, VoO (or VID), and RE is an impedance term, which is shown by the line 257 of the graph 255 of FIG. 11. It can be seen from the equation above that if C1 and C2 are small compared to the total capacitance TC, then RE is dominated by R6.

The equations suggest that accurately measuring the charge Q on each capacitor is critical, which would raise concerns about the change of capacitance. In reality, the measurement remains a voltage measurement, but it is weighted by a charge factor that provides stability for transients and at high frequency. In the SPICE model, changes of 50 percent in the values of the capacitors had no noticeable effect on the output voltage or the dynamic response.

Note in particular that the effects of the impedance R4 are reduced by the factor C1/TC. This means that if C1 is small compared to the total capacitance, the effect of the parasitic impedance R4 becomes small. This has particular significance for using the SCPC as a voltage regulation module (VRM) that is connected to a power distribution system through a connector. Any parasitic impedance in a power distribution system is undesirable, but if the output capacitance on the VRM is small compared to the total capacitance, and if a total charge measurement is used, the problem of the parasitic impedance of a connector is largely mitigated.

Note also that the RE term is attributable to the impedance of the current path through the power distribution system, and it is good practice to minimize this impedance to the extent possible.

When total charge control TQ is used with a switched current power converter that uses a flash a-d to directly control the current switches, as in FIG. 2, the total circuit impedance is the sum of the impedance Rs attributable to the resistor ladder network plus the impedance RE due to the total charge TQ control.

$$Vo=VoO-Io(Rs+RE)$$

This function is shown by the line 275 in the graph 271 of FIG. 12. (The line 273 is the function Vo=VoO−IoRs, from FIG. 4).

It can be seen from the equations that the impedance beyond the last capacitor is very critical. It is also desirable to have as much of the capacitance as close to the load as possible. Output voltage ripple is decreased if the upstream capacitors are smaller, relative to the total capacitance, as this largely mitigates the effects of the upstream motherboard and connector parasitic resistance and inductance.

A serious impediment to using a plug-in VRM is the problem of the connector's parasitic impedance, particularly the parasitic inductance. The total charge control largely overcomes the effects of this parasitic impedance, making it less important as a design tradeoff.

For a low voltage, high current power supply of conventional design, parasitic impedances in the path of current flow is a serious problem. It takes a significant driving voltage to increase the rate of current flow in an inductor, and a higher driving voltage just is not available with present VRMs. This problem is largely overcome with a SCPC using total charge measurement and control.

The equations derived above, and repeated below, show that the impedance R4 is significantly attenuated if C1 is small compared to the total capacitance, TC. In the circuit of FIG. 10, the impedance R4 may simulate the impedance at the connector of a remote VRM and C1 may be a decoupling capacitor within the VRM. The output capacitors C2 and C3 are assumed to be on the motherboard near the processor.

$$RE=(C1/TC)\ R4+((C1+C2)/TC)\ R5+R6,\ \text{in}\ \Omega$$

$$Vo=TQR-Io\ RE$$

An expression in an equation may not make much sense without a feel for what is happening in the circuit. The capacitor C1 may, as an example, be an decoupling capacitor of a VRM that is remote from the output capacitors C2 and C3 and the load. However, it is part of the total charge sensing circuit, and, being directly connected to the VRM, it will be the first to see a response to a drop in the output voltage Vo and the total charge TQ. As an example, let us consider a power distribution system with an output capacitances C2 and C3 totaling 380 µF, and that the hypothetical VRM decoupling capacitor C1 is 20 µF, for a total capacitance TC of 400 µF. If the output voltage decreases 5 mV, the charge Q is decreased by 2 µC. If this charge is replaced entirely on C1, it will result in a voltage rise there of 100 mV. This is sufficient voltage to drive the current through the parasitic impedance R4 of the connector much more rapidly. Yet the total charge sensing and control prevents the voltage from rising excessively. As the charge is transferred to the output capacitors C2 and C3, the voltage on the decoupling capacitor C1 decreases so that the total charge TQ remains correct.

The total charge system measures total charge TQ, and is immune to voltage oscillations within the power distribution network. It will maintain the correct total charge TQ even if the voltages at the various capacitors are ringing. It is very desirable that the power distribution be a damped system. Because the imaginary part of the complex inductance is lossy, and the losses increase rapidly with frequency, it is likely that most real power distribution systems will be damped at the critical frequency.

Figure 13:
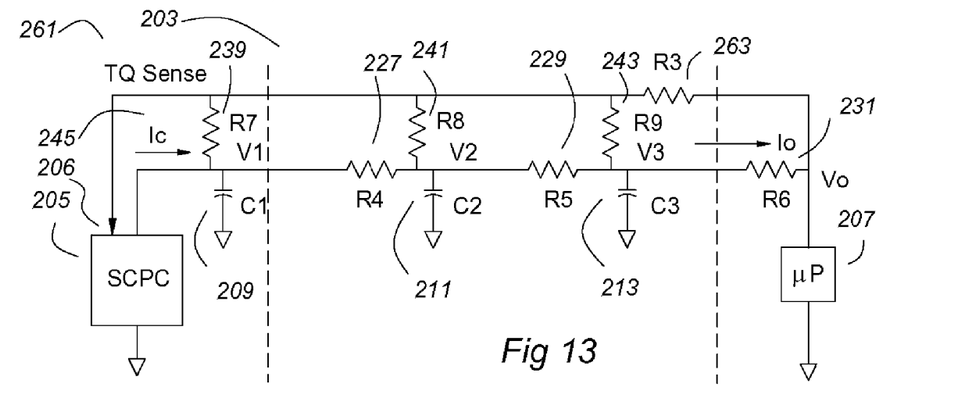
FIG. 13 shows a switched current power converter with a flash a-d control and total charge measurement for control.

Performance may be improved with the addition of a resistor 263 (also identified as R3 for use in the equations) from the total charge sense to the output voltage V0, as shown in FIG. 13. In a SPICE model, a lead-lag network was used here, resulting in lower impedance to a higher frequency.

Let us define a resistance Rp equal to the parallel combination of R7, R8, and R9. Using R3, the equation above (Vo=TQR−Io RE) becomes $$Vo = TQR - Io * RE\left(\frac{R3}{R3 + Rp}\right)$$

In several SPICE models, R3 was approximately equal to Rp and had a lead-lag around it. The impedance attributable to the total charge sense is reduced by one half and the response at 5 MHz was significantly improved. In the limit, with a very small R3, the circuit reduces to a feedback from Vo, and stability issues will be seen as the benefits of the total charge sensing are attenuated.

TQR was shown in 11 to be the no load voltage, which in many processor power supplies is a digital input VID.

FIG. 14 shows a switched charge power converter with total charge measurement 281, which is the switched charge power converter 21 of FIG. 2 providing power to a load 77 (shown as a microprocessor, as an example, not a limitation) through the parasitic impedances of FIGS. 5 and 6. Many of the reference designators are from those figures and refer to the same parts. A total charge high side measurement TQ+ provides the control input to the inverting side (−) of the comparators 23-23 and is derived from the voltages on the high sides of the capacitors 81, 83 and 79 through respective resistors 283, 285 and 287. The conductances of the resistors 283, 285 and 287 are proportional, respectively, to the respective capacitances of the capacitors 81, 83 and 79.

A total charge low side measurement TQ−provides the return reference for the resistor ladder network 25 through the resistors 289, 291 and 293. The conductances of the resistors 289, 291 and 293 are proportional, respectively, to the respective capacitances of the capacitors 81, 83 and 79. However, the proportionality constant for the low side resistors may differ from that of the high side resistors. In fact, it is preferred that the high side resistors 283, 285 and 287 be relatively higher in resistance, while the low side resistors 289, 291 and 293 may be relatively lower in resistance.

A total charge measurement with a flash analog to digital converter provides an extremely fast and stable control. It is extremely simple, thus inexpensive, and only the resistors of the ladder network and its voltage reference need be particularly accurate.

The resistors from the capacitors need not be particularly accurate and no amplifiers or active circuits are needed. The total charge sense can be thought of as a weighted average voltage measurement, nominally equal to the output voltage Vo. If there is only one output capacitor, the total charge measurement and the output voltage are the same. The "lead inductance" of the capacitors causes some spiking in total charge sense signal that is easily rolled off with a small capacitor. The size of the capacitor is not critical, fortunately, as the lead inductance factor may not be well controlled.

The propagation delay through the comparators and the MOSFETs with their drivers is a lag, but it is small. The total charge measurement system is shown in the discussions above as a passive measurement with passive compensation as an input to a flash a-d converter directly driving a SCPC. Its performance is very good, so there may be little incentive to improve on it. However, it is also a suitable input for an error amplifier feedback system, which may allow more elaborate compensation schemes and active error reduction with a very high bandwidth. Conventional error analysis and feedback control techniques are applicable.

The extension to ac analysis is straightforward. For each of the resistors in FIG. 10 that represent parasitic impedances, the ac impedance Z can be substituted to include the reactive components from FIG. 9. Also, include the ac impedances representing the capacitor ESL and ESR. The equations rapidly become complex, so SPICE simulations are suggested.

What is claimed is:

1. A total charge measurement circuit for a power converter having a plurality of output capacitors,
   each of the plurality of output capacitors having first and second capacitor terminals,
   all of the first capacitor terminals being connected through a high side distributed parasitic impedance to a power converter output,
   all of the second capacitor terminals being connected through a low side distributed parasitic impedance to a power converter output return,
   comprising
   a plurality of charge measuring circuits for measuring the charge on each of the plurality of output capacitors,
   a summing circuit for summing together all of the charge on all of the plurality of output capacitors to generate a total charge signal, whereby
   the total charge signal is used by a control circuit that is responsive to the total charge signal to control the power converter.

2. The total charge measurement circuit of claim 1 wherein the plurality of charge measuring circuits comprise a plurality of differential amplifiers.

3. The total charge measurement circuit of claim 2 wherein the summing circuit is a summing amplifier.

4. The total charge measurement circuit of claim 1 wherein the plurality of charge measurement circuits and the summing circuit comprise
- a plurality of high side resistors, there being one high side resistor for each of the plurality of output capacitors,
- each of the plurality of high side resistors having first and second resistor terminals,
- the first resistor terminal of each of the plurality of high side resistors being connected to the first capacitor terminal of one of the plurality of output capacitors,
- the conductance of each of the plurality of high side resistors being proportional to the capacitance of the one of the plurality of output capacitor to which it is connected,
- and the second terminal of each of the plurality of high side resistors being connected in parallel to generate the total charge signal.

5. The total charge measurement circuit of claim 4 wherein the plurality of total charge measurement circuits and the summing circuit further comprises
- a plurality of low side resistors, there being one low side resistor for each of the plurality of output capacitors,
- each of the plurality of low side resistors having first and second resistor terminals,
- the first resistor terminal of each of the plurality of low side resistors being connected to the second capacitor terminal of one of the plurality of output capacitors,
- the conductance of each of the plurality of low side resistors being proportional to the capacitance of the one of the plurality of output capacitor to which it is connected,
- and the second resistor terminal of each of the plurality of low side resistors being connected in parallel to generate a total charge signal return.

6. The total charge measurement circuit of claim 1 further comprising an output voltage feedback resistor,
- the output voltage feedback resistor having first and second resistor terminals, the first resistor terminal of the output voltage feedback resistor being connected to the power converter output, and
- the second resistor terminal of the output voltage feedback resistor being connected to the total charge signal.

7. The total charge measurement circuit of claim 4 wherein the control circuit is a flash analog to digital converter with a resistor ladder network as its reference, and
- the flash analog to digital converter is responsive to the total charge signal.

8. The total charge measurement circuit of claim 5 wherein the control circuit is a flash analog to digital converter with a resistor ladder network as its reference,
- the flash analog to digital converter is responsive to the total charge signal, and the resistor ladder network has the total charge signal return as its return.

* * * * *